United States Patent [19]

Lee et al.

[11] Patent Number: 5,473,639
[45] Date of Patent: Dec. 5, 1995

[54] CLOCK RECOVERY APPARATUS WITH MEANS FOR SENSING AN OUT OF LOCK CONDITION

[75] Inventors: Donald M. Lee; Benny W. H. Lai, both of San Jose, Calif.

[73] Assignee: Hewlett-Packard Company, Palo Alto, Calif.

[21] Appl. No.: 97,688

[22] Filed: Jul. 26, 1993

[51] Int. Cl.⁶ .................................................... H04L 7/033
[52] U.S. Cl. ............................ 375/376; 331/4; 331/16
[58] Field of Search ........................... 375/120; 307/511, 307/514, 517; 328/133; 331/1 A, 4, 14, 16

[56] References Cited

U.S. PATENT DOCUMENTS

| | | | |
|---|---|---|---|
| 4,419,760 | 12/1983 | Bjornholt | 375/120 |
| 4,437,072 | 3/1984 | Asami | 331/1 A |
| 4,523,157 | 6/1985 | Sato | 331/4 |
| 4,933,959 | 6/1990 | Knechtel | 375/120 |
| 4,942,370 | 7/1990 | Shigemori | 331/14 |
| 5,012,494 | 4/1991 | Lai et al. | 375/120 |
| 5,210,509 | 5/1993 | Greeff et al. | 331/4 |
| 5,285,483 | 2/1994 | Ogawa et al. | 375/120 |
| 5,315,270 | 5/1994 | Leonowich | 331/17 |

*Primary Examiner*—Stephen Chin
*Assistant Examiner*—Timothy J. May
*Attorney, Agent, or Firm*—Jonathan B. Penn; Patrick J. Barrett

[57] ABSTRACT

An out of lock condition is sensed on a data transition by transition basis in clock recovery apparatus. When an out of lock condition is sensed, a range sweeping signal is generated and summed with the correction signal to sweep the frequency of the clock signal over the frequency range of the VCO. When an out of lock condition is absent, i.e., when the VCO is phase locked, simulated data transitions are generated in the frequency/phase detector. An out of lock condition is sensed by a D flip-flop. Data is coupled to the clock input of the flip-flop, the clock signal is delayed by a fraction of its nominal period and coupled to the D input of the flip-flop. The state of the Q output of the flip-flop indicates an out of lock condition.

13 Claims, 5 Drawing Sheets

CLOCK RECOVERY APPARATUS WITH MEANS FOR SENSING AN OUT OF LOCK CONDITION

BACKGROUND OF THE INVENTION

This invention relates to clock recovery apparatus for decoding or retiming binary data and, more particularly, to improvements in a phase locked loop for clock recovery.

U.S. Pat. No. 5,012,494 discloses a phase locked loop architecture for clock recovery and NRZ data retiming. A clock signal generated by a voltage controlled oscillator (VCO) is compared with the NRZ data in a frequency/phase detector. The frequency/phase detector has a binary output that serves as an error signal for the phase locked loop. The output of the frequency/phase detector is one binary value when the clock signal leads the data transitions and is the other binary value when the clock signal lags the data transitions. The output of the frequency/phase detector is directly connected to the VCO to make small first order corrections in its phase and is connected through an integrator to the VCO to make larger second order corrections to its frequency. In the frequency acquisition mode, the second order corrections bring the clock signal into frequency synchronization and phase lock with the data transitions. In the phase lock mode, the first order corrections cause the frequency of the clock signal to shift slightly back and forth, i.e., toggle, about the frequency of the data transitions, and thereby maintain phase lock.

The described phase locked loop architecture only corrects the frequency and phase of the clock signal when data transitions are present. Therefore, during long strings of data having the same binary value, the clock frequency can drift, which gives rise to pattern dependent jitter.

A false lock condition can also arise in the described phase locked loop architecture when the data transition and clock signal frequencies are fractionally related. In such case, although correct phase lock to data is absent with the data transitions and the clock signal in phase every several clock cycles, this may "fool" the phase lock circuitry into "thinking" it is in correct phase lock.

In the referenced patent, the VCO comprises a plurality of stages of delay connected in a ring. One of the stages introduces a binary delay depending upon the binary value of the directly applied signal from the frequency/phase detector. Each time the output of the frequency/phase detector changes state, the binary delay changes and the frequency of the VCO toggles back and forth between two values. The remaining stages each introduce an analog delay depending on the output of the integrator, as the loop approaches phase lock. Over temperature, differing analog delays are introduced by the stages, and thus the frequency range of the VCO changes appreciably as a function of temperature. This can cause the phase locked loop to operate improperly.

SUMMARY OF THE INVENTION

According to one aspect of the invention, an out of lock condition is sensed on a data transition by transition basis in clock recovery apparatus based on the above-described phase locked loop architecture. When an out of lock condition is sensed, a range sweeping signal is generated and summed with the signal from the integrator to sweep the frequency of the clock signal over the frequency range of the VCO. The output signal from the integrator is stronger than the range sweeping signal as phase lock is approached so that phase lock is reestablished as the clock frequency sweeps past the frequency of the data transitions.

According to another aspect of the invention, an out of lock condition is sensed on a data transition by transition basis in clock recovery apparatus based on the above described phase locked loop architecture. When an out of lock condition is absent, i.e., when the VCO is phase locked, simulated data transitions are generated in the frequency/phase detector. As a result, in the absence of an out of lock condition, the phase detector continues to generate a changing binary signal even in the absence of actual data transitions, the clock signal is locked in phase to the most recently occurring data transitions, and pattern dependent jitter is virtually eliminated.

In another aspect of the invention an out of lock condition in clock recovery apparatus based on the above described phase locked loop architecture is sensed by a D flip-flop. Data is coupled to the clock input of the flip-flop, the clock signal is delayed by a fraction of its nominal period and coupled to the D input of the flip-flop. The state of the Q output of the flip-flop indicates an out of lock condition.

In another aspect of the invention, clock recovery apparatus based on the above described phase locked loop architecture has a VCO with temperature compensation. A plurality of stages of delay are connected in a ring. A first stage introduces a binary delay depending upon the value of the binary error signal. A second stage introduces an analog delay depending upon the temperature of the stages. The remaining stages introduce an analog delay depending upon the output of the integrator. The delay introduced by the second stage compensates for and offsets the temperature dependent changes in the delay introduced by the remaining stages.

BRIEF DESCRIPTION OF THE DRAWINGS

The features of specific embodiments of the best mode contemplated of carrying out the invention are illustrated in the drawings, in which.

DETAILED DESCRIPTION OF THE SPECIFIC EMBODIMENT

Figure 1:
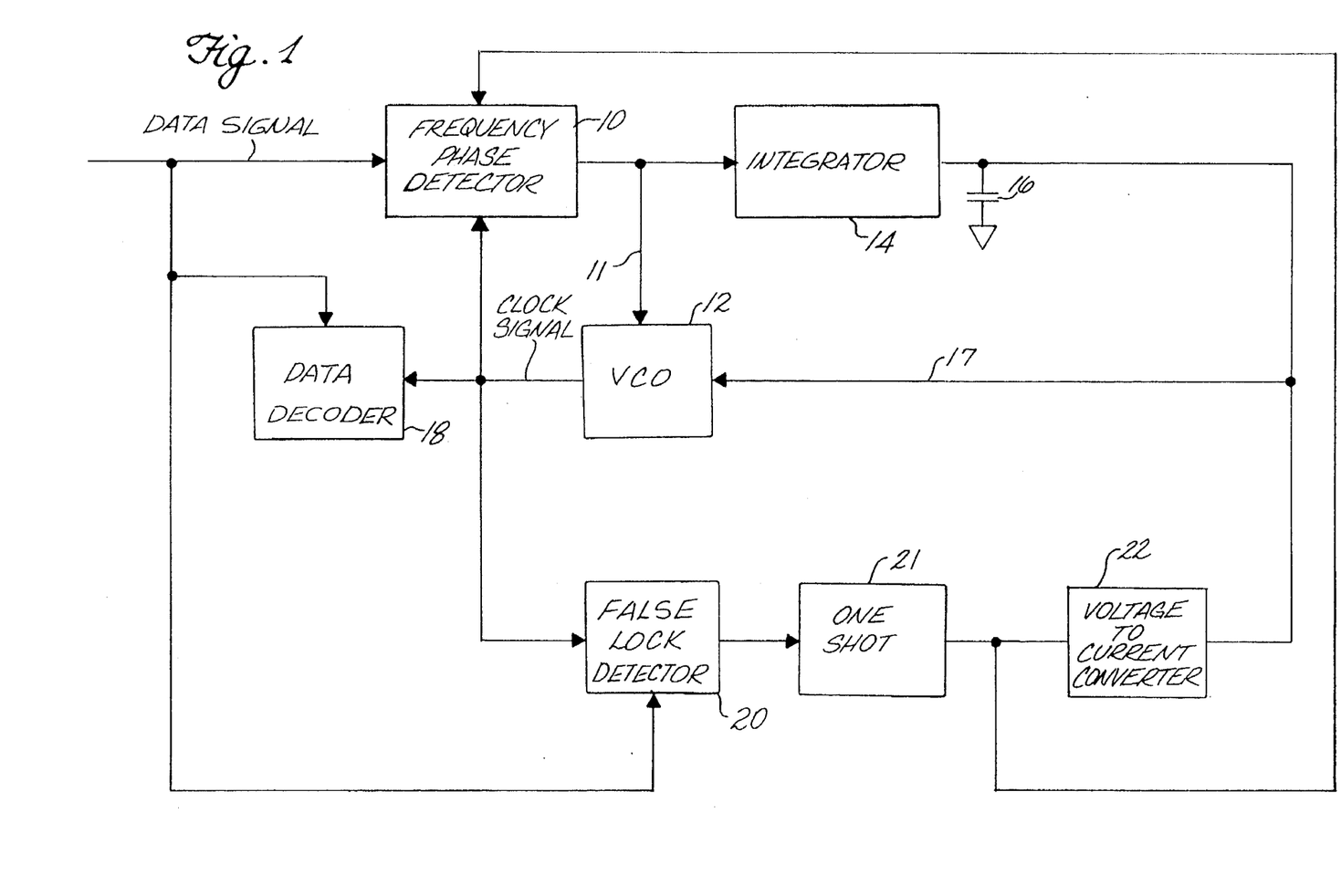
FIG. 1 is a schematic block diagram of clock recovery apparatus incorporating the principals of the invention.

In FIG. 1, a data signal from a source of binary data is coupled to one input of a frequency/phase detector 10. By way of example, the binary data could be encoded in NRZ format at 622 megabits per second. A clock signal from a voltage controlled oscillator (VCO) 12 is coupled to another input of frequency/phase detector 10. Frequency/phase detector 10 generates at its output a binary error signal that depends upon the phase relationship between the transitions of the data signal and the clock signal. For example, if the data transitions lead the clock signal in phase, the binary error signal is high, and if the data transitions lag the clock signal in phase, the binary error signal is low. The output of frequency/phase detector 10 is directly connected to a control input 11 of VCO 12 and is connected to the input of an integrator 14, which includes an output capacitor 16. When the binary error signal is high, integrator 14 generates a current that charges capacitor 16 in one direction. When the binary signal is low, integrator 14 generates a current that charges capacitor 16 in the other direction. The output of integrator 14 is connected to a control input 17 of VCO 12. The data signal and the clock signal are coupled to a data decoder 18, which decodes the data signal into binary ones and zeros or retimes or regenerates the data signal. These components are described in detail in U.S. Pat. No. 5,012,494, the disclosure of which is incorporated herein fully by reference.

The binary error signal applied to input 11 of VCO 12 introduces small, fixed, corrective changes in the frequency of the clock signal. As the value of the binary error signal changes, the fixed corrective frequency toggle back and forth between two frequency values. This constitutes a first order corrective loop. The output signal from integrator 14 introduces large variable corrective changes in the frequency of the clock signal, depending upon the analog value of the output signal. This constitutes a second order corrective loop. In the acquisition mode, the influence of the output of integrator 14 predominates the control function as the frequency of VCO 12 frequency locks the clock signal unto the data transitions. In the phase lock mode, the output of integrator 14 (the voltage across capacitor 16) is quiescent and the binary error signal predominates the control function to maintain the frequency of VCO 12 in phase lock with the data transitions.

According to one aspect of the invention, the clock signal and the data signal are applied to a false lock detector 20, which is described in detail below in connection with FIG. 2. False lock detector 20 compares the data signal and the clock signal on a data transition by transition basis. When a false lock is detected, a one shot 21 is triggered to actuate a voltage to current converter 22. Converter 22 injects a charging current into the secondary loop across capacitor 16, which interrupts the false lock operation and sweeps the frequency of VCO 12 first toward one limit of the VCO frequency range, e.g., the lower limit, and then toward the other limit, e.g. the upper limit. Converter 22 is designed so its charging current is smaller than the charging current supplied to capacitor 16 by integrator 14 near phase lock. When the VCO in frequency sweeps past the frequency of the clock signal, it phase locks thereto as described above because the charging current from integrator 14 is stronger near phase lock than the charging current from converter 22. During the time interval required to sweep the frequency of VCO 12, one shot 21 times out and thus ignores any further signals from false lock detector 20. This permits VCO 12 to sweep through its complete frequency range in both directions without being interrupted by a new false lock signal. The described circuitry is preferably incorporated onto a single integrated circuit chip.

Figure 2:
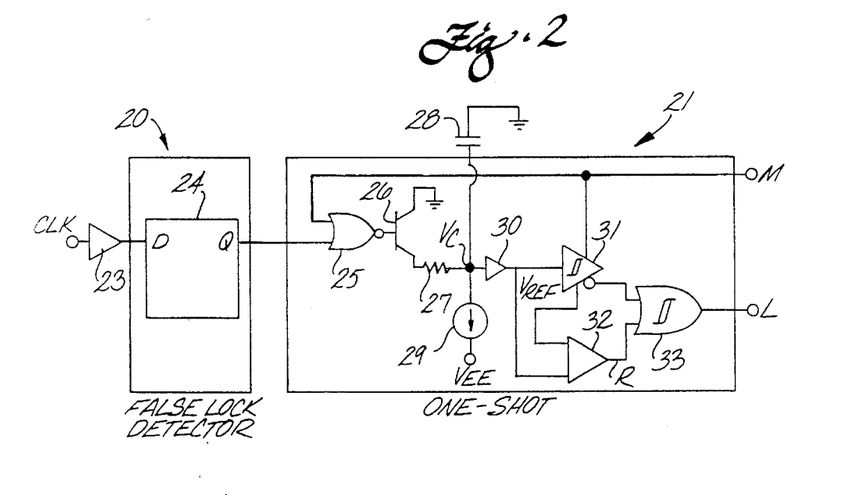
FIG. 2 is a schematic circuit diagram of the false lock detector and one shot of FIG. 1.

As illustrated in FIG. 2, false lock detector 20 comprises a delaying amplifier 23 and a D flip-flop 24. The clock signal is applied to the input of delaying amplifier 23, which delays the clock signal such that the transitions of the data are aligned to a known state of the clock, for example, three quarters of its nominal period, or 1.2 nanoseconds. The output of delaying amplifier 23 is applied to the D input of flip-flop 24. The data signal thus delayed is applied to the D input of flip-flop 24. The Q output of flip-flop 24 is connected to one input of a NOR gate 25 in one shot 21.

Figure 3:
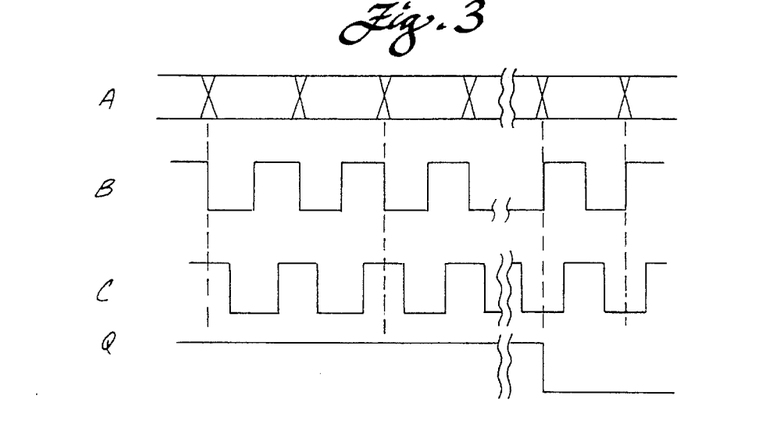
FIG. 3 is a waveform diagram representing the operation of the false lock detector of FIG. 2.

In FIG. 3, waveform A represents the data transitions. Waveform B represents the clock signal. When the clock signal is in phase lock with the data transitions, as shown at the beginning of FIG. 3, one of the edges of the clock signal, i.e., the high to low transition, is aligned with the data transitions. Waveform C represents the clock signal as delayed by amplifier 23. The delayed clock signal is sampled by flip-flop 24 on a data transition by transition basis. When there is true phase lock between the clock signal and the data transitions, the sampled values are all high and the Q output of flip-flop 24 is also high. When the Q output of flip-flop 24 goes low as shown at the end of waveform B, true phase lock is lost. In summary, flip-flop 24 compares the phase of each data transition with the clock to sense an out of lock condition and generates at the Q output a signal that indicates when a data transition is out of phase with the clock signal by a predetermined amount, e.g., one half cycle. The signal at the Q output is unchanging, e.g., a binary "1", while data transitions are in phase with the clock signal and the Q output changes between a binary "1" and a binary "0", depending upon the binary value of the data, while the data transitions are out of phase with the clock signal.

In one shot 21, the output of NOR gate 25 is connected to the base of a transistor 26. The collector of transistor 26 is grounded and the emitter of transistor 26 is connected by a resistor 27 to a node $V_c$. A capacitor 28 is connected between node $V_c$ and ground and a current source 29 is connected between node $V_c$ and a power supply $V_{EE}$. Node $V_c$ is coupled by a buffer amplifier 30 to a Schmitt trigger 31 and a comparator 32. Schmitt trigger 31 has a noninverting output connected to an output terminal M and the other input of NOR gate 25. Schmitt trigger 31 also has an inverting output that is connected to one input of an OR gate 33. As indicated, the input signal to comparator 32 is compared with a reference voltage $V_{REF}$. When the input signal is larger than the reference signal, the output of comparator 32 is high. When the input signal is lower than the reference signal, the output of comparator 32 is low. The reference signal is coupled to Schmitt trigger 31 to set its thresholds symmetrically above and below the reference voltage.

Figure 4:
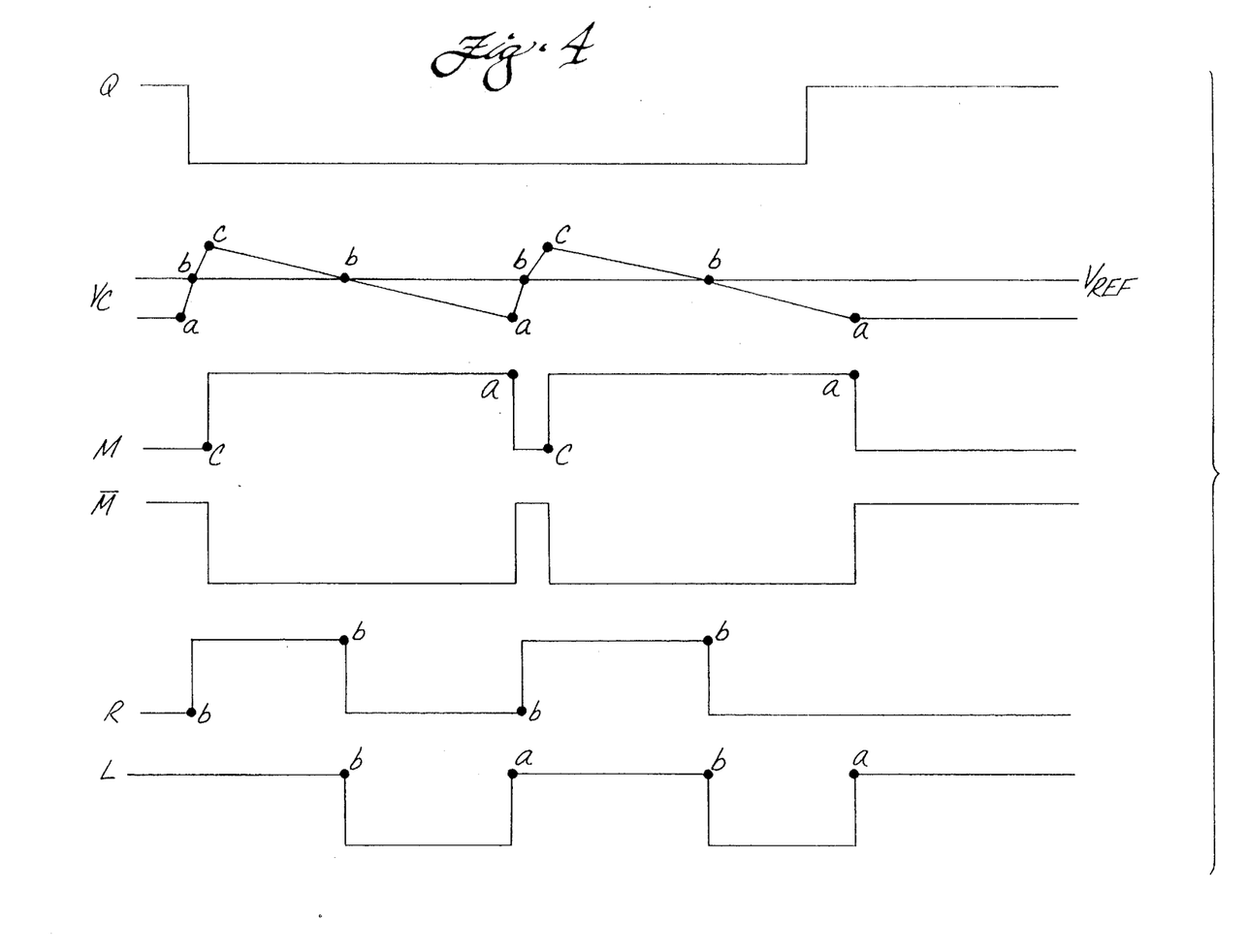
FIG. 4 is a waveform diagram representing the operation of the one shot of FIG. 2.

When the clock signal goes out of lock, the Q output of flip flop 24 goes low, as illustrated in waveform Q of FIG. 4. The output of NOR gate 25 then goes high to turn on transistor 26. Capacitor 28 charges rapidly through transistor 26 from a point a to a point c, as illustrated in waveform $V_c$ of FIG. 4. Points a and c represent the two thresholds of Schmitt trigger 31. As capacitor 28 rises above the reference voltage at a point b in waveform $V_c$, the output of comparator 32 goes high, as depicted in waveform R in FIG. 4. Capacitor 28 charges to the high threshold of Schmitt trigger 31, as represented by point c in waveform $V_c$. At such time, Schmitt trigger 31 changes state and output terminal M goes high, as depicted at point c in waveform M in FIG. 4. By virtue of the connection to OR gate 25, this serves to mask out the effect of any further errors at the Q output of flip flop 24, because transistor 26 turns off and remains turned off irrespective of the state of the Q output of flip flop 24. When transistor 26 turns off, capacitor 28 is slowly discharged by current source 29. As capacitor 28 once again passes the voltage reference at point b, the output of comparator 32 goes low, as depicted in waveform R, the inverting output of Schmitt trigger 31 remains low, depicted by waveform $\overline{M}$ in FIG. 4, and output terminal L goes low, as depicted in waveform L. Capacitor 28 continues to discharge until the voltage at node $V_c$ reaches the low threshold of Schmitt trigger 31, as depicted at point a in waveform $V_c$. At this point, Schmitt trigger 31 changes state, the M output goes low, as depicted in waveform M in FIG. 4, and output terminal L goes high, as depicted by waveform L in FIG. 4. Thereafter, the described cycle repeats so long as the out of lock condition persists.

During each cycle, which is of the order of milliseconds, capacitor 28 has a short charging interval and a long discharging interval, as illustrated in waveform $V_c$. Many data transitions actually occur during the short charging interval between points a and c in waveform $V_c$. Each time the Q output of flip flop 24 goes high during this charging interval, charging is interrupted. As a result, in order to reach point c, the Q output of flip flop 24 must transition from high to low at a certain rate, which ensures that one shot 21 will not trigger due to transient conditions and thus maintains stable operation. Once the long discharging interval of capacitor 28 begins, further errors detected by flip flop 24 are ignored, i.e., masked, until the discharge is completed, i.e., until waveform $V_c$ reaches point a again. This ensures that voltage to current converter 22 is not interrupted once VCO 12 begins to sweep through its frequency range, as described above.

Although the phase lock loop is shown as being single ended, it is preferably implemented with differential circuitry as appropriate, e.g., emitter coupled logic circuitry. As a result, integrator 14 actually can have two charging capacitors, one charging in a positive polarity relative to ground and one charging in a negative polarity relative to ground and there are two connections from integrator 14 and voltage to current converter 22 to VCO 12, one for each signal polarity. Alternatively, a single differential capacitor could be used.

Figure 5:
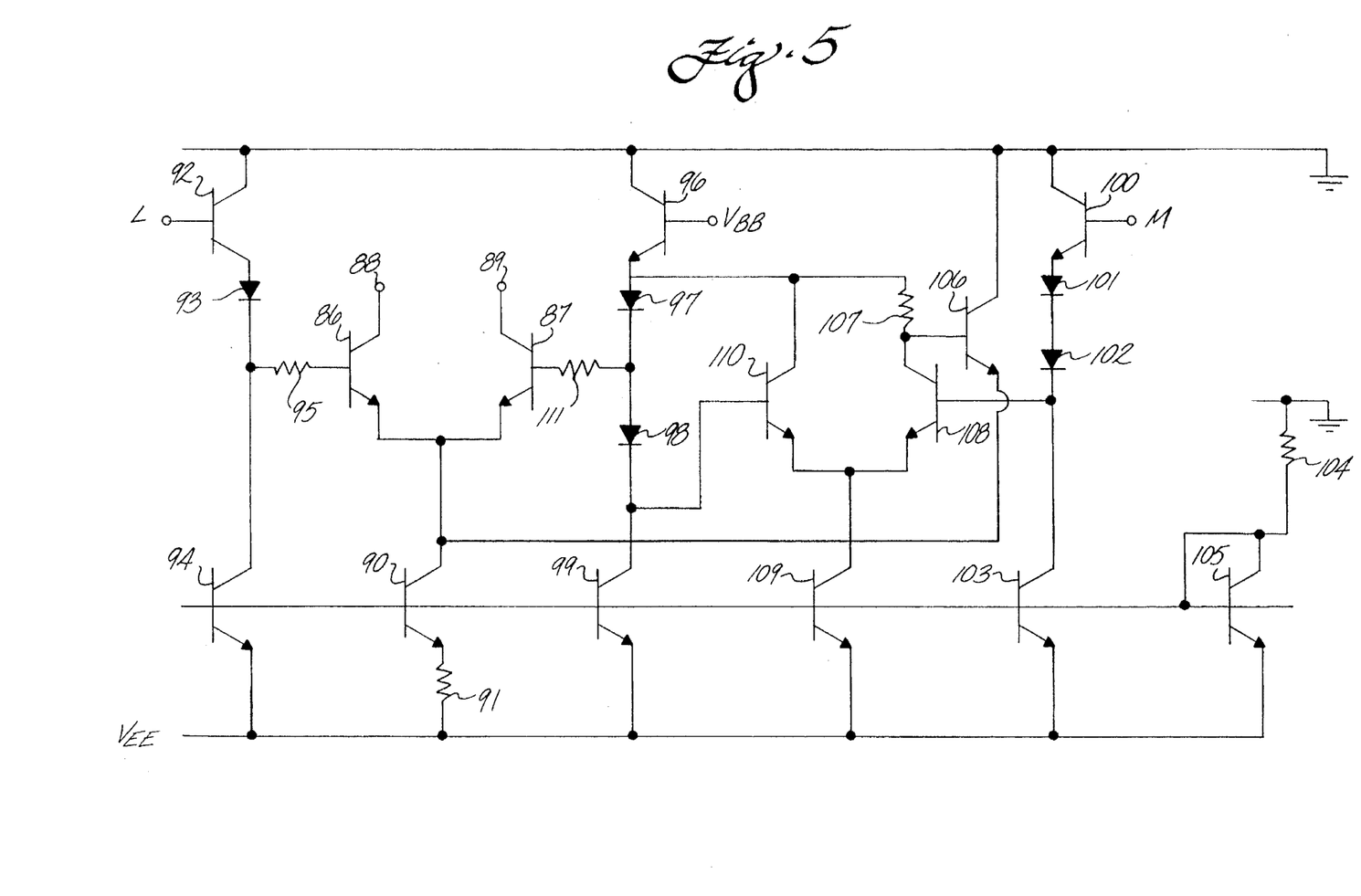
FIG. 5 is a schematic circuit diagram of the voltage to current converter of FIG. 1.

As illustrated in FIG. 5, voltage to current converter 22 comprises differentially connected transistors 86 and 87 having collectors that are connected respectively to differential output terminals 88 and 89. The collector to emitter circuit of a transistor 90 and a resistor 91 connect the emitters of transistors 86 and 87 to a power supply $V_{EE}$. The collector to emitter circuit of a transistor 92, a level shifting diode 93, and the collector to emitter circuit of a transistor 94 are connected in series between ground and power supply $V_{EE}$. Output terminal L (FIG. 2) is connected to the base of transistor 92. The collector of transistor 94 is connected by a resistor 95 to the base of transistor 86. The collector to emitter circuit of a transistor 96, level shifting diodes 97 and 98, and the collector to emitter circuit of a transistor 99 are connected in series between ground and power supply $V_{EE}$. A fixed bias $V_{BB}$, which is midway between the high and low voltage levels applied to terminal L, is connected to the base of transistor 96. The collector to emitter circuit of a transistor 100, level shifting diodes 101 and 102, and the collector to emitter circuit of a transistor 103 are connected in series between ground and power supply $V_{EE}$. Output terminal M (FIG. 2) is connected to the base of transistor 100. A collector resistor 104 and the collector to emitter circuit of a transistor 105 are connected in a series between ground and power supply $V_{EE}$. The collector of transistor 105 is directly connected to its base to form a diode. The collector to emitter circuit of a transistor 106 is connected in series between ground and the collector of transistor 90. A resistor 107, the collector to emitter circuit of a transistor 108, and the collector to emitter circuit of a transistor 109 are connected in series between the junction of the emitter of transistor 96 and diode 97 and power supply $V_{EE}$. The base of transistor 106 is connected to the collector of transistor 108. The base of transistor 108 is connected to the collector of transistor 103. The collector to emitter circuit of a transistor 110 is connected between the junction of the collector of transistor 96 and diode 97 and the collector of transistor 109. The base of transistor 110 is connected to the collector of transistor 99. The base of transistor 87 is connected by a resistor 111 to the junction of diodes 97 and 98. Resistor 104 and transistor 105 provide a bias voltage to the bases of transistors 90, 94, 99, 103, and 109, which serve as current sources to bias the transistors to which they are connected. Transistors 86, 87, and 106 serve as differential transistors stages, only one of which is turned on at a time, depending upon which one has the highest base voltage. Transistor 106 is biased so its base voltage swings between a low level that is smaller than the base voltage of either transistor 86 or 87 and a high level that is larger than the base voltage of either transistor 86 or 87.

In operation, while one shot 21 is timing out terminal M is low, transistor 108 is turned off, and differential transistors 86 and 87 operate in a normal fashion. When output terminal L is high, transistor 86 is turned on and transistor 87 is turned off. As a result, a capacitor charging current is applied to output terminal 88. When output terminal L is low, transistor 87 is turned on and transistor 86 is turned off. As a result, a capacitor charging current is applied to output terminal 89. Thus, current is injected into the phase locked loop to cause the frequency of VCO 12 to swing first toward one limit, i.e., the low frequency limit, and then toward the other limit, i.e., the high frequency limit.

When output terminal M goes low, the operation of differential transistors 86 and 87 is automatically shut down. Transistor 108 turns off and transistor 110 turns on, thereby raising the voltage at the base of transistor 106. This causes transistor 106 to dominate differential transistors 86 and 87, which shuts off charging current to both output terminals 88 and 89.

The described apparatus aids frequency acquisition and phase lock by interrupting false phase lock operation and sweeping through the frequency range of VCO 12 when false lock is detected.

False lock detector 20 and one shot 21 serve two functions. First, they interrupt operation of the phase locked loop, as described above, when an out of lock or false lock condition occurs. Second, during a true lock condition, they ensure that the binary error signal continues to change value even in the absence of data transitions. This prevents the frequency of VCO 12 from drifting when the binary value of the data signal remains the same for long periods.

Figure 6:
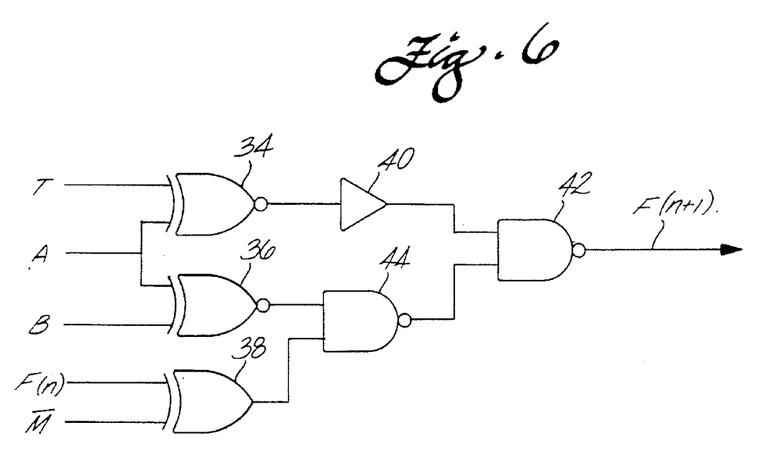
FIG. 6 is a schematic logic diagram of a portion of the phase/frequency detector of FIG. 1.

Output terminal $\overline{M}$ of one shot 21 is also connected to frequency/phase detector 10 to simulate data transitions when none are present during phase lock. FIG. 6 is a modification of the state logic device shown in FIG. 6 of Pat. No. 5,012,494. The modified state logic device has inputs T, A, B, F(n), and $\overline{M}$. Input A is connected to exclusive NOR gates 34 and 36. Input T is connected to gate 34 and input B is connected to gate 36. Inputs F(n) and $\overline{M}$ are connected to an exclusive OR gate 38. Gate 34 is coupled by a delay stage 40 to a NAND gate 42. Exclusive NOR gate 36 and exclusive OR gate 38 are coupled by a NAND gate 44 to NAND gate 42. Instead of directly applying input F(n) to NAND gate 44, input F(n) and input $\overline{M}$ are coupled to NAND gate 44 by exclusive OR gate 38.

Table I below is a logic table of the combination of states when input $\overline{M}$ is low, which represents an out of lock condition.

TABLE I

| $\overline{M}$ | A | T | B | F(n) | F(n + 1) | COMMENT |
|---|---|---|---|---|---|---|
| 0 | 0 | 0 | 0 | 0 | 0 | Let it Ride |
| 0 | 0 | 0 | 0 | 1 | 1 | Let it Ride |
| 0 | 0 | 0 | 1 | 0 | 0 | Clock is early |
| 0 | 0 | 0 | 1 | 1 | 0 | Clock is early |
| 0 | 0 | 1 | 0 | 0 | 1 | fc < fd |
| 0 | 0 | 1 | 0 | 1 | 1 | fc < fd |
| 0 | 0 | 1 | 1 | 0 | 1 | Clock is late |
| 0 | 0 | 1 | 1 | 1 | 1 | Clock is late |
| 0 | 1 | 0 | 0 | 0 | 1 | Clock is late |
| 0 | 1 | 0 | 0 | 1 | 1 | Clock is late |
| 0 | 1 | 0 | 1 | 0 | 1 | fc < fd |
| 0 | 1 | 0 | 1 | 1 | 1 | fc < fd |
| 0 | 1 | 1 | 0 | 0 | 0 | Clock is early |
| 0 | 1 | 1 | 0 | 1 | 0 | Clock is early |
| 0 | 1 | 1 | 1 | 0 | 0 | Let it ride |
| 1 | 1 | 1 | 1 | 1 | 1 | Let it ride |

When input $\overline{M}$ is low, the signal on input F(n) passes through exclusive NOR gate 38 unchanged and the circuitry operates in the manner described in U.S. Pat. No. 5,012,494.

Table II below is a logic table of the combination of states when input $\overline{M}$ is high, which represents a true phase lock condition.

TABLE II

| M | A | T | B | F(n) | FP(n + 1) | COMMENT |
|---|---|---|---|---|---|---|
| 1 | 0 | 0 | 0 | 0 | 1 | Toggle |
| 1 | 0 | 0 | 0 | 1 | 0 | Toggle |
| 1 | 0 | 0 | 1 | 0 | 0 | Clock is early |
| 1 | 0 | 0 | 1 | 1 | 0 | Clock is early |
| 1 | 0 | 1 | 0 | 0 | 1 | fc < fd |
| 1 | 0 | 1 | 0 | 1 | 1 | fc < fd |
| 1 | 0 | 1 | 1 | 0 | 1 | Clock is late |
| 1 | 0 | 1 | 1 | 1 | 1 | Clock is late |
| 1 | 1 | 0 | 0 | 0 | 1 | Clock is late |
| 1 | 1 | 0 | 0 | 1 | 1 | Clock is late |
| 1 | 1 | 0 | 1 | 0 | 1 | fc < fd |
| 1 | 1 | 0 | 1 | 1 | 1 | fc < fd |
| 1 | 1 | 1 | 0 | 0 | 0 | Clock is early |
| 1 | 1 | 1 | 0 | 1 | 0 | Clock is early |
| 1 | 1 | 1 | 1 | 0 | 1 | Toggle |
| 1 | 1 | 1 | 1 | 1 | 0 | Toggle |

When input $\overline{M}$ is high, exclusive OR gate 38 inverts the signal at input F(n), which serves to simulate data transitions in phase with the most recently occurring data transitions in the absence of actual data transitions. In terms of Tables I and II, $\overline{M}$=O, when input $\overline{M}$ is low; $\overline{M}$=1, when input $\overline{M}$ is high; and A=T=B when there are no data transitions.

As depicted in table I, when input $\overline{M}$ is low and data transitions are absent, the last binary value of the output of frequency/phase detector 10, (Fn), and the present binary value of the output of frequency/phase detector 10, F(n+1), remain the same. This logic, as described in U.S. Pat. No. 5,012,494, inherently has a frequency component, and will aid the VCO to achieve frequency lock. Toggling the frequency of VCO 12 during the acquisition mode would disable the frequency component of the detector and inhibit achievement of frequency lock. For this reason, simulated data transitions are not generated in the acquisition mode. Instead, the apparatus is in a "Let It Ride" mode, which means that the binary error signal at the output of frequency/phase detector 10 does not change state in the absence of actual data transitions.

As depicted in table II, when input $\overline{M}$ is high and data transitions are absent, the last binary value of the output of frequency/phase detector 10, (Fn), and the present binary value of the output of frequency/phase detector 10, F(n+1), are different by virtue of the logic of exclusive OR gate 38. As a result, the frequency of VCO 12 toggles back and forth about the frequency of VCO 12 at the time of the last actual data transition.

Figure 7:
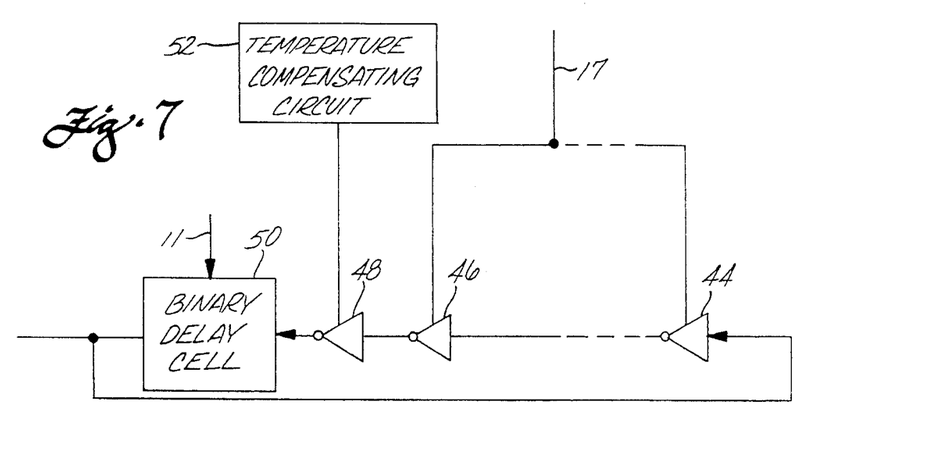
FIG. 7 is a schematic block diagram of the voltage controlled oscillator of FIG. 1.

As shown in FIG. 7, VCO 12 comprises an odd number of inverting, variable delay stages 44, 46 and 48 connected in series. The output of stage 48 is connected to the input of a binary delay cell 50, which introduces one of two delays depending upon the state, high or low, of the binary error signal at the output of frequency/phase detector 10. Thus, stages 44, 46 and 48 introduce analog delays into the loop and cell 50 introduces binary delays of one value or the other into the loop. The output of binary delay cell 50, which serves as the clock signal, is fed back to the input of stage 44 to form a variable delay ring. The output of integrator 14 is applied to the delay control input of stages 44 and 46, which serves as input 17, to introduce an analog delay into the loop dependent on the charge across capacitor 16. A temperature compensating circuit 52, described in detail below, is connected to the delay control input of stage 48 to introduce an analog delay in the loop dependent upon its temperature. Since the described circuitry is packaged on a single integrated circuit chip, stages 44, 46, and 48 are all at the same temperature. As the delay introduced by stages 44 and 46 changes, e.g., increases due to temperature, the delay introduced by stage 48 changes in the other direction, i.e., decreases, to compensate therefor. As a result, changes in the limits of the frequency range of VCO 12 are minimized.

Figure 8:
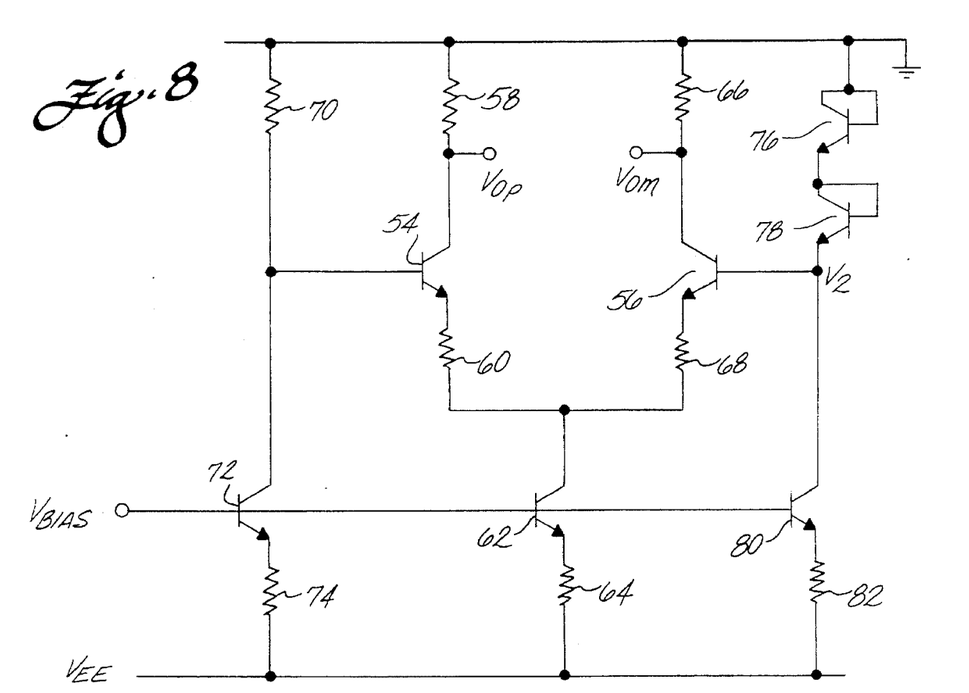
FIG. 8 is a schematic circuit diagram of the temperature compensating circuit of FIG. 5.

As illustrated in FIG. 8, temperature compensating circuit 52 comprises transistors 54 and 56 connected as a differential amplifier between ground and power supply $V_{EE}$. A collector resistor 58, the collector to emitter circuit of transistor 54, an emitter resistor 60, the collector to emitter circuit of a transistor 62, and an emitter resistor 64 are connected in series between ground and power supply $V_{EE}$. A collector resistor 66, the collector to emitter circuit of transistor 56, and an emitter resistor 68 are connected in series between ground and the collector of transistor 62. A resistor 70 having a predetermined temperature coefficient is connected between ground and the base of transistor 54. The collector to emitter circuit of a transistor 72 and an emitter resistor 74 are connected in series between the base of transistor 54 and power supply $V_{EE}$. Diode connected transistors 76 and 78 are connected in series between ground and the base of transistor 56. The collector to emitter circuit of a transistor 80 and a emitter resistor 82 are connected in series between the base of transistor 56 and power supply $V_{EE}$. Transistors 62, 72 and 80 serve as constant current sources to bias differential transistors 54 and 56. A source of bias voltage, $V_{BIAS}$, is connected to their bases. An output terminal $V_{OP}$ is connected to the collector of transistor 54. An output terminal $V_{OM}$ is connected to the collector of transistor 56. When the ambient temperature changes, the differential voltage across output terminals $V_{OP}$ and $V_{OM}$ also changes. Output terminals $V_{OP}$ and $V_{OM}$ are connected to the differential control input of stage 48 (FIG. 7), to change the delay introduced thereby accordingly. Assuming that the delay introduced by stages 44 and 46 increases with temperature, the delay introduced by stage 48 decreases with temperature to maintain the same frequency range of control over VCO 12.

The described embodiment of the invention is only considered to be preferred and illustrative of the inventive concept; the scope of the invention is not to be restricted to such embodiments. Various and numerous other arrangements may be devised by one skilled in the art without departing from the spirit and scope of this invention.

What is claimed is:

1. Clock recovery apparatus comprising:
    a source of binary data, the binary data having data transitions;
    a voltage controlled oscillator for generating a clock signal that has a variable frequency over a range of frequencies;
    a phase detector responsive to the data transitions and the clock signal for generating a binary error signal having a first value when the actual data transitions lead the clock signal in phase and a second value when the data transitions lag the clock signal in phase;
    first means responsive to changes in the value of the binary error signal for controlling the oscillator to introduce changes in the frequency of the clock signal to phase lock onto the data transitions;
    means for integrating the binary error signal;
    second means responsive to the integrated signal for controlling the oscillator to introduce changes in the frequency of the clock signal to correct the frequency of the oscillator;
    a D flip-flop having a D input, a clock input, and a Q output;
    means for coupling the binary data to the clock input of the flip-flop and coupling the clock signal to the D input of the flip-flop so phased with respect to each other that the Q output of the flip-flop remains unchanged while the clock signal remains phase locked unto the data transitions and the Q output of the flip-flop changes state to designate an out of lock condition while the clock signal is not phase locked unto the data transitions;
    means responsive to the Q output of the flip flop for generating a range sweeping signal; and
    means for coupling the range sweeping signal to the oscillator to sweep the frequency of the clock signal over the clock frequency range, thereby reestablishing a phase locked condition.

2. The apparatus of claim 1, in which the oscillator has a frequency range, and the range sweeping signal generated by the means for generating a range sweeping signal first sweeps the frequency in one direction to adjust the frequency to one limit of the frequency range of the oscillator and then sweeps the frequency in the other direction to adjust the frequency to the other limit of the frequency range of the oscillator.

3. The apparatus of claim 1 or 2, additionally comprising: means in the absence of actual data transitions for generating simulated data transitions when an out of lock condition is not sensed; and
    means for applying the simulated data transitions to the phase detector so the phase detector is responsive to the simulated data transitions in the absence of actual data transitions.

4. The apparatus of claim 3, in which the means for generating simulated data transitions generates simulated data transitions in phase with the most recently occurring data transitions.

5. The apparatus of claim 1, in which the transitions occur at a nominal period and the clock signal is coupled to the D input of the flip-flop delayed by a fraction of the nominal period to generate at the Q output of the flip-flop the out of lock signal.

6. The apparatus of claim 1, 2, 4, or 5, in which the oscillator comprises a plurality of stages of delay connected in a ring, one of the stages introducing a binary delay depending upon the binary value of the signal applied to a first input, another stage introducing an analog delay depending upon the signal applied to a second input, the remaining stages introducing an analog delay depending upon the signal applied to a third input; means for coupling the binary signal to the first input; means for coupling the integrated signal to the second input, and means for applying to the second input a temperature dependent signal that compensates for temperature dependent changes in the delays introduced by the remaining stages.

7. The apparatus of claim 1, additionally comprising means for integrating the Q output of the flip-flop, the range sweep signal being generated after the integrated Q output of the flip-flop reaches a predetermined value.

8. The apparatus of claim 1, in which the first controlling means introduces incrementally fixed changes in the frequency of the clock signal.

9. The apparatus of claim 8, in which the incrementally fixed changes are smaller than the changes introduced by the second controlling means.

10. The apparatus of claim 9, in which the second controlling means introduces variable changes in the frequency of the clock signal.

11. The apparatus of claim 1, in which the second controlling means introduces variable changes in the frequency of the clock signal.

12. The apparatus of claim 11, in which the variable changes introduced by the second controlling means are larger than the changes introduced by the first controlling means.

13. Clock recovery apparatus comprising:
    a source of binary data on a single data channel, the binary data having data transitions occurring at a given nominal period;
    a voltage controlled oscillator for generating a clock signal that has a variable frequency over a range of frequencies;
    a phase detector responsive to the data transitions on the single data channel and the clock signal for generating a binary error signal having a first value when the data transitions lead the clock signal in phase and a second value when the data transitions lag the clock signal in phase;
    first means responsive to changes in the value of the binary error signal for controlling the oscillator to introduce changes in the frequency of the clock signal to phase lock onto the data transitions;

means for integrating the binary error signal;

second means responsive to the integrated signal for controlling the oscillator to introduce changes in the frequency of the clock signal to correct the frequency of the oscillator;

a D flip-flop having a D input, a clock input, and a Q output having two states; and means for coupling the binary data to the clock input of the flip-flop and coupling the clock signal to the D input of the flip-flop so phased with respect to each other that the Q output of the flip-flop remains unchanged while the clock signal is phase locked onto the data transitions and the Q output of the flip-flop changes state while the clock signal is not phase locked onto the data transitions.

* * * * *